(12) United States Patent
Qin et al.

(10) Patent No.: US 11,326,251 B2
(45) Date of Patent: May 10, 2022

(54) METHOD FOR PREPARING SURFACE-ACTIVE ONION-LIKE CARBON NANOSPHERES BASED ON VAPOR DEPOSITION

(71) Applicant: Taiyuan University of Technology, Shanxi (CN)

(72) Inventors: Lei Qin, Shanxi (CN); Weifeng Liu, Shanxi (CN); Yan Cui, Shanxi (CN); Xuguang Liu, Shanxi (CN); Yongzhen Yang, Shanxi (CN)

(73) Assignee: Taiyuan University of Technology, Shanxi (CN)

( * ) Notice: Subject to any disclaimer, the term of this patent is extended or adjusted under 35 U.S.C. 154(b) by 262 days.

(21) Appl. No.: 16/798,827

(22) Filed: Feb. 24, 2020

(65) Prior Publication Data
US 2021/0010132 A1    Jan. 14, 2021

(30) Foreign Application Priority Data
Jul. 8, 2019    (CN) .......................... 201910607599.8

(51) Int. Cl.
| | |
|---|---|
| *B32B 9/00* | (2006.01) |
| *C23C 16/26* | (2006.01) |
| *C01B 32/18* | (2017.01) |
| *B01J 31/16* | (2006.01) |
| *C23C 16/455* | (2006.01) |
| *B82Y 30/00* | (2011.01) |
| *B82Y 40/00* | (2011.01) |

(52) U.S. Cl.
CPC ........... *C23C 16/26* (2013.01); *B01J 31/1616* (2013.01); *C01B 32/18* (2017.08); *C23C 16/45519* (2013.01); *C23C 16/45534* (2013.01); *B82Y 30/00* (2013.01); *B82Y 40/00* (2013.01); *C01P 2004/32* (2013.01); *C01P 2004/64* (2013.01); *Y10T 428/30* (2015.01)

(58) Field of Classification Search
CPC ....... Y10T 428/30; B82Y 30/00; B82Y 40/00; C23C 16/26
USPC ......................................................... 428/408
See application file for complete search history.

(56) References Cited

U.S. PATENT DOCUMENTS

| | | | |
|---|---|---|---|
| 2013/0079262 A1* | 3/2013 | Pol ....................... | C10M 177/00 508/116 |
| 2016/0222216 A1* | 8/2016 | Predtechenskiy ....... | C01B 32/16 |

FOREIGN PATENT DOCUMENTS

CN            101143385 A        3/2008

* cited by examiner

*Primary Examiner* — Daniel H Miller
(74) *Attorney, Agent, or Firm* — Collard & Roe, P.C.

(57) ABSTRACT

The present invention discloses a method for preparing surface-active onion-like carbon nanospheres based on vapor deposition, comprising: directly preparing high-surface-activity onion-like carbon nanospheres formed by coating ferroferric oxide nano-particles on an onion-like graphitized shell by taking liquid small organic molecule alkane n-dodecane as a carbon source to perform chemical vapor deposition at high temperature of 650~700° C. in an inert carrier gas environment with existence of a ferrocene catalyst. An onion-like carbon nanosphere product prepared according to the present invention has good surface activity and thermal stability, is wide in practicability, and can be widely applied to the fields of adsorbing materials, energy storage materials, catalytic materials, medical materials and the like.

14 Claims, 4 Drawing Sheets

METHOD FOR PREPARING SURFACE-ACTIVE ONION-LIKE CARBON NANOSPHERES BASED ON VAPOR DEPOSITION

CROSS REFERENCE TO RELATED APPLICATIONS

Applicant claims priority under 35 U.S.C. § 119 of Chinese Application No. 201910607599.8 filed on Jul. 8, 2019, the disclosure of which is incorporated by reference.

TECHNICAL FIELD

The present invention belongs to the technical field of preparation of carbon nanomaterials, and relates to a preparation method of carbon nanospheres, particularly relates to a method for preparing onion-like carbon nanospheres.

BACKGROUND

Onion-like carbon nanospheres show excellent performances in the aspects of electrics, photics, magnetics and mechanics due to a unique hollow cage structure, good leakproofness, multi-layer graphite coating, large specific surface area, high conductivity and good thermal stability.

A chemical vapor deposition method is simple in technology and strong in controllability, and can realize massive synthesis of onion-like carbon nanospheres. According to a preparation process, generally, low molecular hydrocarbon is cracked to be a carbon source at certain temperature and pressure, the carbon source is gradually deposited on a pre-prepared catalyst, and onion-like carbon nanospheres grow on the surface of the catalyst. Currently, different carbon sources and catalysts are still main research directions of preparation of onion-like carbon nanospheres by adopting a chemical vapor deposition method [Materials, 2018, 11: 822-857].

In existing researches, onion-like carbon nanospheres are mainly prepared by adopting gaseous, solid or semi-solid carbon sources. Wang et al. [Diamond & Related Materials, 2006, 15: 147-150] synthesized Fe-encapsulating onion-like carbon nanospheres by adopting a chemical vapor deposition method by taking acetylene as a carbon source and ferrocene as a catalyst; He et al. [Materials Chemistry & Physics, 2006, 97(1): 109-115] synthesized hollow onion-like carbon nanospheres and metal particle-encapsulating onion-like carbon nanospheres by adopting a chemical vapor deposition method by taking methane as a carbon source, Ni as a catalyst and Al as a catalyst carrier; Zhang et al. [Carbon, 2011, 49(4): 1151-1158] synthesized Fe-encapsulating and Ni-encapsulating onion-like carbon nanospheres or hollow onion-like carbon nanospheres by adopting a chemical vapor deposition method by catalyzing decomposition of methane with an Ni—Fe catalyst at temperature of below 850° C.; CN 101143385A obtained onion-like metal nickle-encapsulating carbon particles by adopting a chemical vapor deposition method by taking deoiled asphalt as a raw material and metal nickel powder as a catalyst in a condition with temperature of 1000° C.

However, the surfaces of onion-like carbon nanospheres prepared according to the foregoing method are generally inert, and lack of active oxygen-containing functional groups, and thus need further activation and modification in subsequent application. Therefore, it is of high practical value to develop a method for preparing high-surface-activity onion-like carbon nanospheres directly by adopting a chemical vapor deposition method.

SUMMARY

The present invention is directed to provide a method for preparing surface-active onion-like carbon nanospheres based on vapor deposition, so as to improve the problem that the surface activity of onion-like carbon nanospheres prepared by adopting existing chemical vapor deposition methods is low.

According to the method for preparing surface-active onion-like carbon nanospheres based on vapor deposition, high-surface-activity onion-like carbon nanospheres formed by coating ferroferric oxide nano-particles on an onion-like graphitized shell are directly prepared by taking liquid small organic molecule alkane n-dodecane as a carbon source to perform chemical vapor deposition at high temperature of 650~700° C. in an inert carrier gas environment with existence of a ferrocene catalyst.

The use amount of the catalyst ferrocene is 0.050~0.055 time of that of the carbon source n-dodecane, and the catalyst ferrocene plays a role of promoting coating of the onion-like graphitized shell as a kernel.

According to the present invention, optimally, the carbon source and the catalyst are added into water to prepare an aqueous dispersion, the use amount of the water is 2~3 times of the volume of the carbon source, and the water plays a role of sufficiently dispersing the carbon source and the catalyst and providing oxygen atoms for reaction.

According to the present invention, the chemical vapor deposition reaction time is 15~20 min.

Further, the inert carrier gas flow in the chemical vapor deposition reaction process is 5+/−1 mL/min.

Optimally, in the preparation process of the surface-active onion-like carbon nanospheres disclosed by the present invention, the flow of the inert carrier gas is timely adjusted according to the change of temperature. Specifically, according to the present invention, the inert carrier gas flow is controlled to be not greater than 3 mL/min in a temperature rise period, and after temperature rises to a reaction temperature, the inert carrier gas flow is adjusted to 5+/−1 mL/min to perform chemical vapor deposition reaction.

Onion-like carbon nanospheres prepared according to the present invention are black powder particles with uniform particle size, the average particle size being about 30 nm, wherein an $Fe_3O_4$ nanocrystalline metal kernel of about 20 nm is coated inside the carbon nanosphere, an outer layer being of an onion-like graphitized shell structure, and thermal stability is good.

The prepared onion-like carbon nanospheres have certain surface activity due to containing of rich active oxygen-containing functional groups such as hydroxyls and carbonyls.

According to the present invention, surface-active onion-like carbon nanospheres are prepared directly by adopting a chemical vapor deposition method by taking liquid small organic molecule n-dodecane as a carbon source, ferrocene as a catalyst and water as a dispersion liquid, therefore, not only is preparation method simple and cost low, but also a prepared product is high in purity, has a clear onion-like graphitized shell, has good surface activity and thermal stability, is wide in practicability, and can be applied to the fields of adsorbing materials, energy storage materials, catalytic materials, medical materials and the like.

DESCRIPTION OF THE EMBODIMENTS

The following embodiments are merely preferred technical schemes of the present invention, and are not used for limiting the present invention in any form. A person skilled in the art may make various changes and variations. Any modification, equivalent replacement or improvements made within the spirit and principle of the present invention should fall within the protection scope of the present invention.

Embodiment 1

Taking 2.5 mL (1.9 g) of n-dodecane and weighing 0.1 g of ferrocene, putting into 5 mL of deionized water together to perform ultrasonic mixing uniformly, and then putting the mixture into a quartz boat. Putting the quartz boat in the middle of a horizontal resistance furnace tube, and placing a glass slide at the tail portion in the furnace tube for products collection.

Adjusting carrier gas flow to 30 mL/min by taking argon as a carrier gas to exhaust air in the furnace tube and start to heat; when temperature is risen to 100° C. at a temperature rise rate of 10° C./min, adjusting carrier gas flow down to 3 mL/min; continuing to rise temperature to 700° C. at a same temperature rise rate, adjusting carrier gas flow to 5 mL/min, and reacting for 20 min, so that vaporized n-dodecane performs sufficient carbonation reaction in a high temperature reaction zone to deposit on the glass slide prearranged in the furnace tube.

After reaction is ended, adjusting carrier gas flow to 10 mL/min, naturally cooling to room temperature and then taking out the glass slide, and scraping to collect a black sediment on the glass slide, to obtain the pure surface-active onion-like carbon nanospheres.

Figure 1:
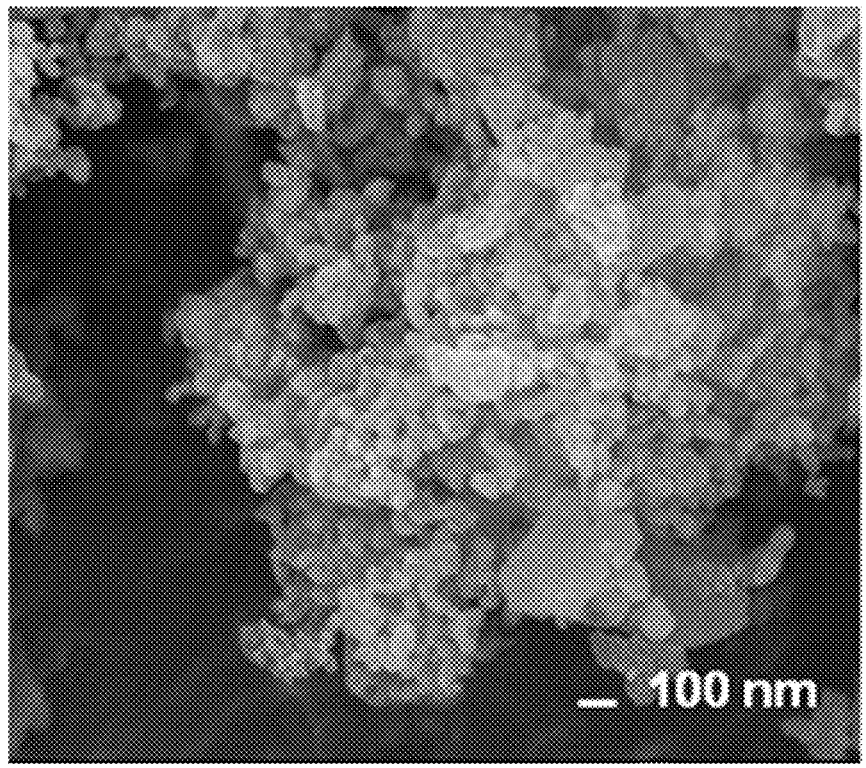
FIG. 1 is a field emission scanning electron microscope morphological image of surface-active onion-like carbon nanospheres prepared according to the present invention.

FIG. 1 shows a field emission scanning electron microscope morphological image of prepared surface-active onion-like carbon nanospheres. It may be seen that the surface-active onion-like carbon nanospheres present spherical or spheroid shapes, and are uniform in morphology, and narrow in particle size distribution scope, with average particle size of about 30 nm.

Figure 2:
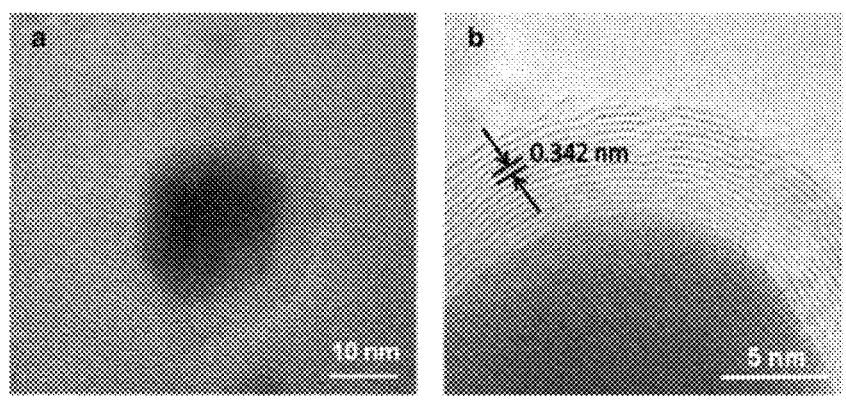
FIG. 2 shows transmission electron microscope morphological images of surface-active onion-like carbon nanospheres prepared according to the present invention.

FIG. 2 shows transmission electron microscope morphological images of the surface-active onion-like carbon nanospheres, wherein a) is a transmission electron microscope image of a single onion-like carbon nanosphere, and b) is a local amplified image of carbon layers of a). It is known from FIG. 2 that the onion-like carbon nanospheres are metal-encapsulating nano carbon spheres of about 30 nm, the size of an internal metal kernel is about 20 nm, the thickness of an external encapsulating carbon layer is about 5 nm, and it may be further observed from b) that a dozen of onion-like graphitized shells with equal distance exist on the carbon layer, and the measurement distance is about 0.342 nm, which is close to the layer distance of 0.336 of graphite, indicating that the graphitization degree of the product is better.

Figure 3:
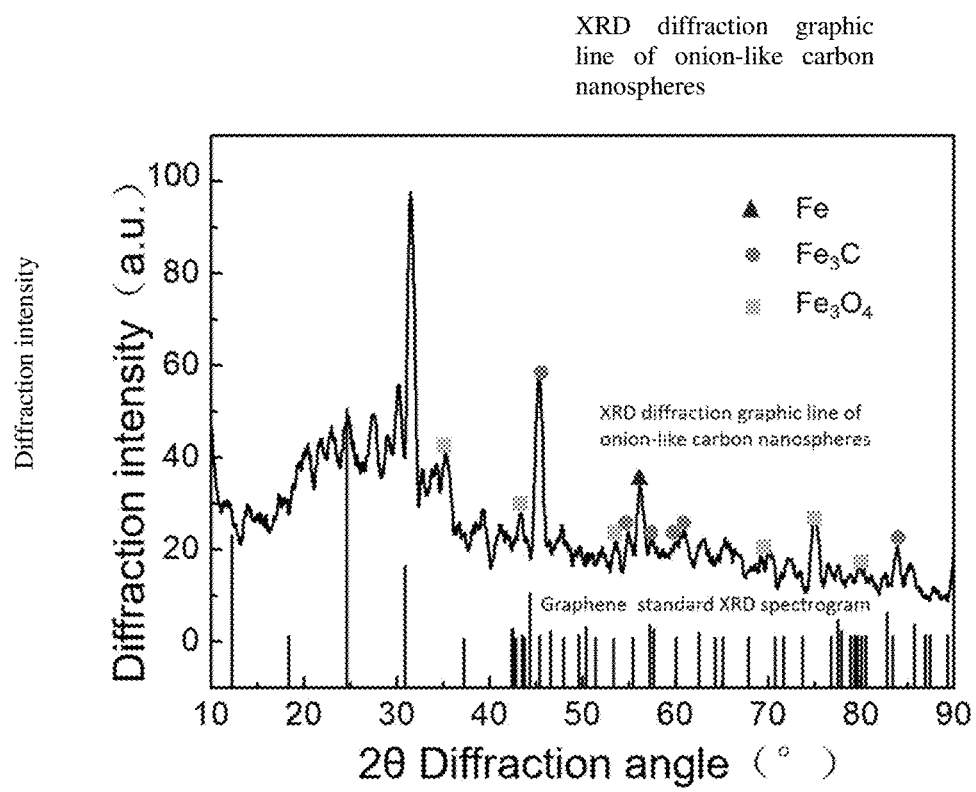
FIG. 3 is an X-ray diffraction intensity diagram of surface-active onion-like carbon nanospheres prepared according to the present invention.

FIG. 3 is an X-ray diffraction intensity diagram of surface-active onion-like carbon nanospheres. In FIG. 3, a relatively wide diffraction peak exists in a scope from 10° to 30°, and a strongest peak exists near 26.2°, indicating forming of a graphite layer corresponding to a carbon (002) crystal plane. Relatively strong diffraction peaks appear at 30.2°, 35.3°, 43.2°, 53.5°, 57.1° and 62.9°, which respectively belong to (220), (311), (400), (422), (511), (440) crystal planes of $Fe_3O_4$. Moreover, characteristic peaks of $Fe_3C$ exist at 45° and 65°, and characteristic peaks of Fe appear between 35° and 50°, indicating that carbon may generate a carbon thermal reduction reaction with $Fe_3O_4$ in a high temperature condition, and carbon can reduce $Fe_3O_4$ to be zero-valent ferrum. Meanwhile, zero-valent ferrum also plays a certain promoting role on the graphitization degree of carbon at high temperature.

Figure 4:
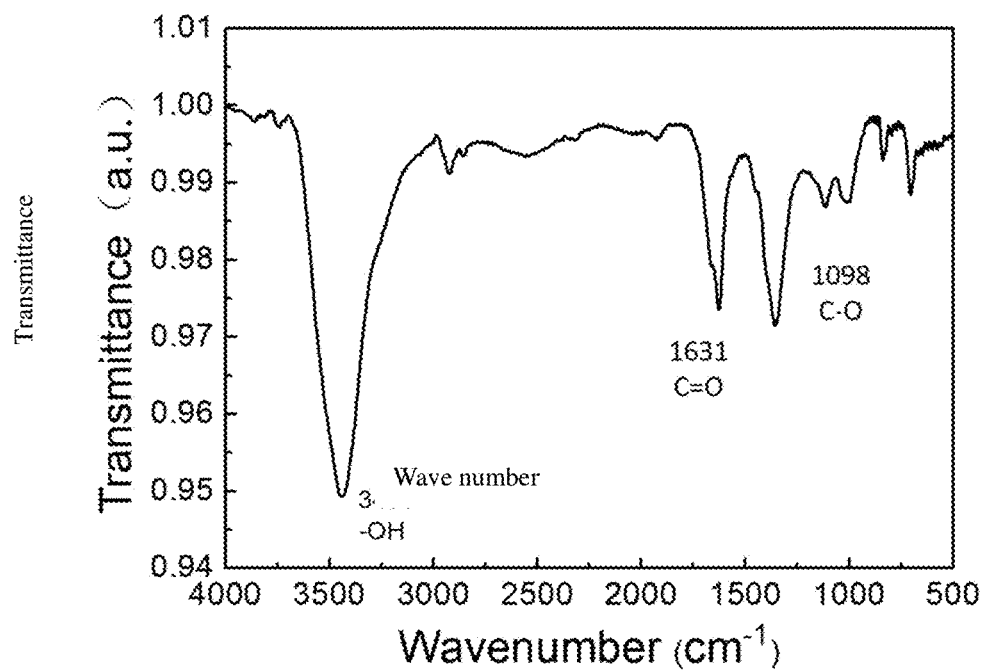
FIG. 4 is an infrared spectrogram of surface-active onion-like carbon nanospheres prepared according to the present invention.

FIG. 4 is an infrared spectrogram of surface-active onion-like carbon nanospheres. Absorption peaks at 3435, 1631 and 1098 $cm^{-1}$ respectively indicate the existence of oxygen-containing functional groups —OH, C=O and C—O, indicating that the surfaces of onion-like carbon nanospheres prepared by taking n-dodecane as a carbon source have a certain quantity of active oxygen-containing functional groups.

Figure 5:
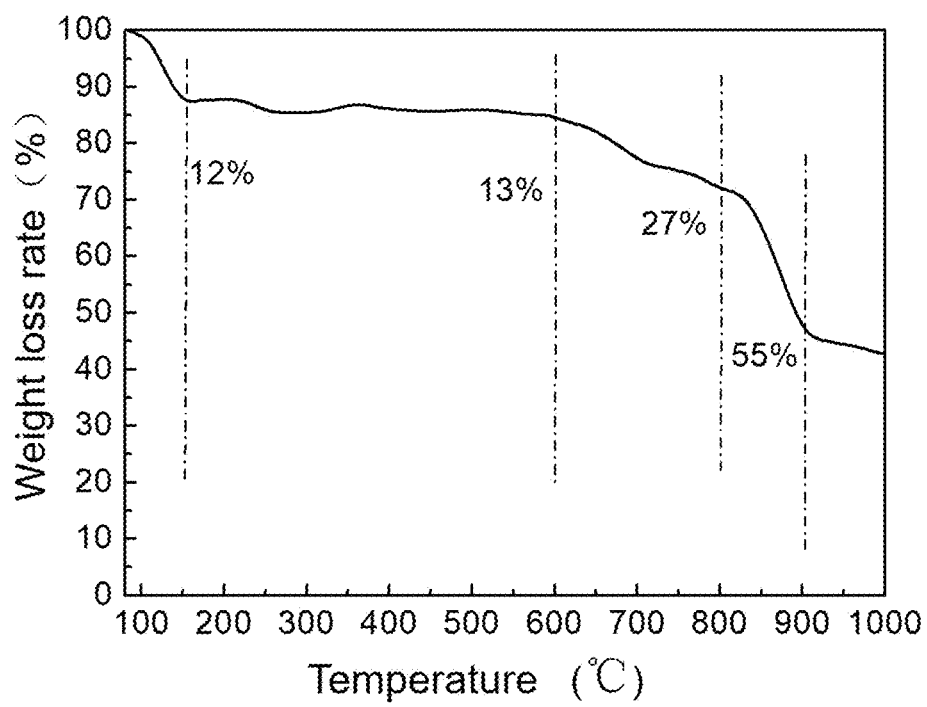
FIG. 5 is a thermal weight loss curve graph of surface-active onion-like carbon nanospheres prepared according to the present invention.

FIG. 5 is a thermal weight loss curve graph of surface-active onion-like carbon nanospheres measured in a nitrogen atmosphere. It is shown in FIG. 5 that along with temperature rise, 12% of weight loss of the product before 150° C. mainly comes from removal of moisture in a sample. Subsequently, there is hardly any weight loss in a temperature scope from 150° C. to 600° C., indicating that the onion-like carbon nanospheres have better thermal stability. Along with further rise of temperature, when reaching 900° C., the total weight loss of the onion-like carbon nanospheres is about 55%, that is because a carbon layer is damaged along with continuous increase of temperature, further carbonization of a carbon layer on the outer layer of a material, loss of surface-active functional groups, generation of a carbon ion compound and catalytic action of Fe, therefore, the mass of surface-active onion-like carbon nanospheres is rapidly reduced after high temperature thermal treatment of over 800° C.

Embodiment 2

Taking 1.5 mL (1.1 g) of n-dodecane and weighing 0.1 g of ferrocene, putting into 5 mL of deionized water together to perform ultrasonic mixing uniformly, and then putting the mixture into a quartz boat. Putting the quartz boat in the middle of a horizontal resistance furnace tube, and placing a glass slide at the tail portion in the furnace tube for products collection.

Performing carbonation reaction according to conditions of embodiment 1, to prepare surface-active onion-like carbon nanospheres with particle size of about 30 nm.

Embodiment 3

Taking 2.5 mL (1.9 g) of n-dodecane and weighing 0.1 g of ferrocene, putting into 10 mL of deionized water together to perform ultrasonic mixing uniformly, and then putting the mixture into a quartz boat. Putting the quartz boat in the middle of a horizontal resistance furnace tube, and placing a glass slide at the tail portion in the furnace tube for products collection.

Performing carbonation reaction according to conditions of embodiment 1, to prepare surface-active onion-like carbon nanospheres with particle size of about 30 nm.

Comparative Example 1

Taking 3.5 mL (2.6 g) of n-dodecane and weighing 0.1 g of ferrocene, putting into 5 mL of deionized water together to perform ultrasonic mixing uniformly, and then putting the mixture into a quartz boat. Putting the quartz boat in the middle of a horizontal resistance furnace tube, and placing a glass slide at the tail portion in the furnace tube for products collection, and performing carbonation reaction according to conditions of embodiment 1.

Figure 6:
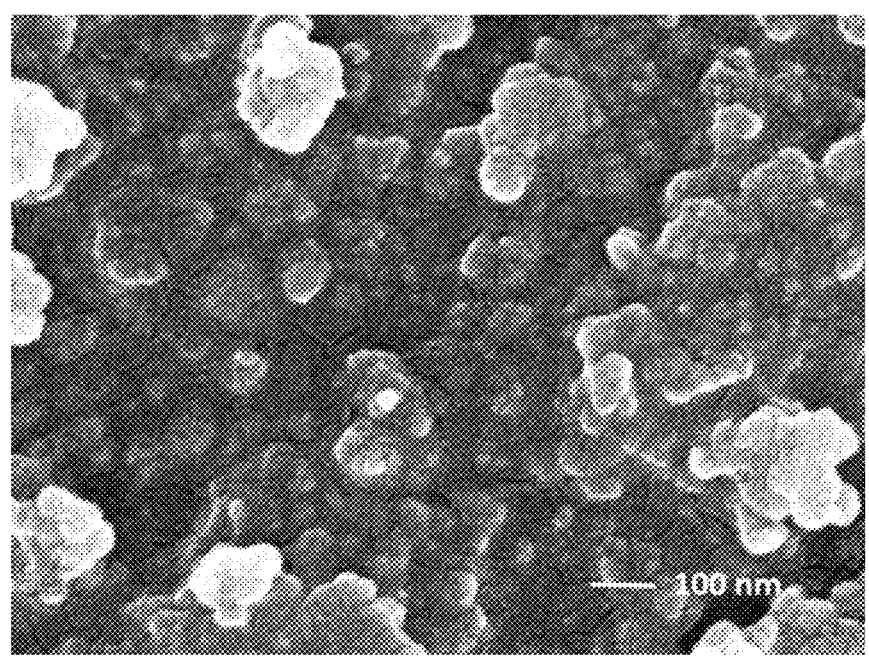
FIG. 6 is a field emission scanning electron microscope morphological image of a product prepared in a comparative example 1.

FIG. 6 shows a field emission scanning electron microscope morphological image of a prepared product. It may be seen from FIG. 6 that when the amount of the carbon source n-dodecane is too high, the corresponding product carbon spheres are seriously agglomerated, as a result, granular spherical products cannot be obtained.

Comparative Example 2

Taking 2.5 mL (1.9 g) of n-dodecane and weighing 0.1 g of ferrocene, putting into 5 mL of deionized water together to perform ultrasonic mixing uniformly, and then putting the mixture into a quartz boat. Putting the quartz boat in the middle of a horizontal resistance furnace tube, and placing a glass slide at the tail portion in the furnace tube for products collection.

Adjusting carrier gas flow to 30 mL/min by taking argon as a carrier gas to exhaust air in the furnace tube and start to heat; when temperature is risen to 100° C. at a temperature rise rate of 10° C./min, adjusting carrier gas flow down to 3 mL/min; continuing to rise temperature to 600° C. at a same temperature rise rate, adjusting carrier gas flow to 5 mL/min, and reacting for 20 min, so that vaporized n-dodecane performs sufficient carbonation reaction in a high temperature reaction zone to deposit on the glass slide prearranged in the furnace tube.

After reaction is ended, adjusting carrier gas flow to 10 mL/min, naturally cooling to room temperature and then taking out the glass slide, and scraping to collect a black sediment on the glass slide.

Figure 7:
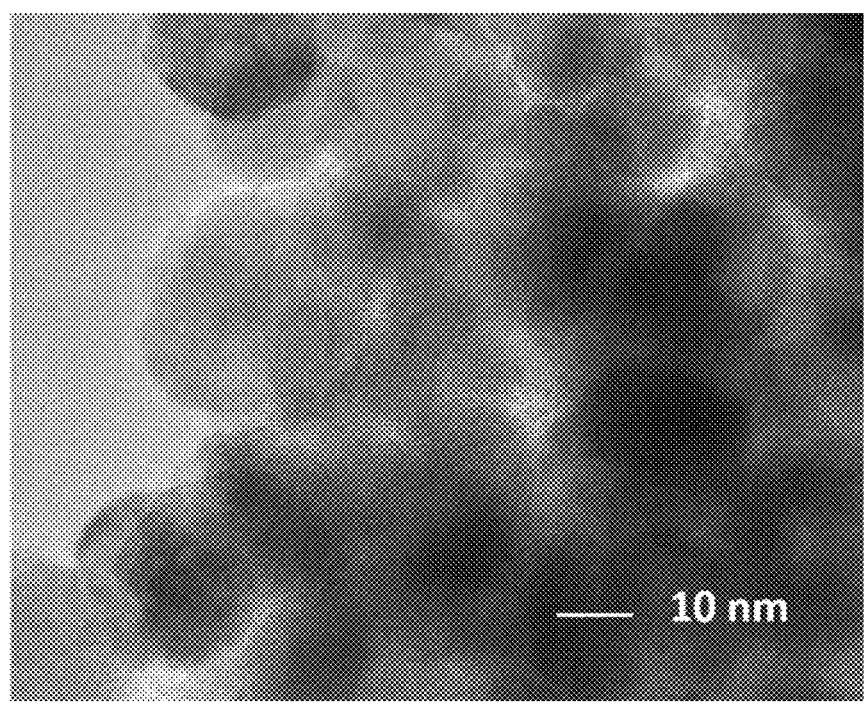
FIG. 7 is a transmission electron microscope morphological image of a product prepared in a comparative example 2.

It may be seen from a transmission electron microscope morphological image of a prepared product shown in FIG. 7 that when carbonization temperature is lowered, the carbon source fails to be effectively carbonized and adhered to the catalyst $Fe_3O_4$ metal particles, as a result, carbon nanosphere products with an onion-like structure are not obtained.

Comparative Example 3

Other conditions are all the same as those in embodiment 1, and the difference only lies in that reaction is only performed for 10 min after temperature rises to 700° C., and then an obtained produced is collected.

Because reaction time is too short, the carbon source fails to be effectively carbonized and adhered to the catalyst $Fe_3O_4$ metal particles, the transmission electron microscope image of the corresponding product is similar to that in FIG. 7, only $Fe_3O_4$ metal particles are obtained, and carbon nanosphere products of an onion-like structure are not obtained.

Comparative Example 4

Other conditions are all the same as those in embodiment 1, and the difference only lies in that reaction is extended to 30 min after temperature rises to 700° C., and then an obtained product is collected.

Due to reaction time extension and carrier gas purging, under the action of surface tension and diffusion force, catalyst particles are held up, to push a thermal carbon layer to grow along a length direction, meanwhile, pyrolytic carbon settles continuously, so as to finally obtain multi-walled carbon nanotubes.

What is claimed is:

1. A method for preparing surface-active onion-like carbon nanospheres based on vapor deposition, comprising: directly preparing high-surface-activity onion-like carbon nanospheres formed by coating ferroferric oxide nano-particles on an onion-like graphitized shell by taking liquid small organic molecule alkane n-dodecane as a carbon source to perform chemical vapor deposition at high temperature of 650~700° C. in an inert carrier gas environment with existence of a ferrocene catalyst.

2. The method according to claim 1, wherein the use amount of the catalyst ferrocene is 0.050~0.055 time of the mass of the carbon source n-dodecane.

3. The method according to claim 1, wherein the carbon source and the catalyst are added into water to prepare an aqueous dispersion.

4. The method according to claim 3, wherein the use amount of the water is 2~3 times of the volume of the carbon source.

5. The method according to claim 1, wherein the chemical vapor deposition reaction time is 15~20 min.

6. The method according to claim 1, wherein the inert carrier gas flow in the chemical vapor deposition reaction process is 5+/−1 mL/min.

7. The method according to claim 6, wherein the inert carrier gas flow is controlled to be not greater than 3 mL/min in a temperature rise period, and after temperature rises to a reaction temperature, adjusting the inert carrier gas flow to 5+/−1 mL/min.

8. Surface-active onion-like carbon nanospheres prepared by the method according to claim 1, wherein an $Fe_3O_4$ nanocrystalline metal kernel is coated inside the carbon nanosphere, and an outer layer being of an onion-like graphitized shell structure, with average particle size of 30 nm.

9. Surface-active onion-like carbon nanospheres prepared by the method according to claim 2, wherein an $Fe_3O_4$ nanocrystalline metal kernel is coated inside the carbon nanosphere, and an outer layer being of an onion-like graphitized shell structure, with average particle size of 30 nm.

10. Surface-active onion-like carbon nanospheres prepared by the method according to claim 3, wherein an $Fe_3O_4$ nanocrystalline metal kernel is coated inside the carbon nanosphere, and an outer layer being of an onion-like graphitized shell structure, with average particle size of 30 nm.

11. Surface-active onion-like carbon nanospheres prepared by the method according to claim 4, wherein an $Fe_3O_4$ nanocrystalline metal kernel is coated inside the carbon nanosphere, and an outer layer being of an onion-like graphitized shell structure, with average particle size of 30 nm.

12. Surface-active onion-like carbon nanospheres prepared by the method according to claim 5, wherein an $Fe_3O_4$ nanocrystalline metal kernel is coated inside the carbon nanosphere, and an outer layer being of an onion-like graphitized shell structure, with average particle size of 30 nm.

13. Surface-active onion-like carbon nanospheres prepared by the method according to claim 6, wherein an $Fe_3O_4$ nanocrystalline metal kernel is coated inside the carbon nanosphere, and an outer layer being of an onion-like graphitized shell structure, with average particle size of 30 nm.

14. Surface-active onion-like carbon nanospheres prepared by the method according to claim 7, wherein an $Fe_3O_4$ nanocrystalline metal kernel is coated inside the carbon nanosphere, and an outer layer being of an onion-like graphitized shell structure, with average particle size of 30 nm.

* * * * *